United States Patent
Kirchhoff et al.

[11] Patent Number: 6,096,654
[45] Date of Patent: Aug. 1, 2000

[54] GAPFILL OF SEMICONDUCTOR STRUCTURE USING DOPED SILICATE GLASSES

[75] Inventors: Markus M. Kirchhoff, Ottendorf-Olrilla, Germany; Matthias Ilg, Richmond, Va.

[73] Assignee: Siemens Aktiengesellschaft, Munich, Germany

[21] Appl. No.: 08/942,273

[22] Filed: Sep. 30, 1997

[51] Int. Cl.[7] .................................................. H01L 21/302
[52] U.S. Cl. ........................ 438/699; 438/632; 438/633; 438/645; 438/646; 438/692; 438/760; 438/698
[58] Field of Search ..................................... 438/632, 633, 438/645, 646, 692, 760, 698, 699, 694

[56] References Cited

U.S. PATENT DOCUMENTS

| | | | |
|---|---|---|---|
| 5,004,704 | 4/1991 | Maeda et al. | 437/195 |
| 5,094,984 | 3/1992 | Lui et al. | 437/225 |
| 5,286,681 | 2/1994 | Maeda et al. | 437/240 |
| 5,656,556 | 8/1997 | Yang | 438/646 |
| 5,716,890 | 2/1998 | Yao | 438/624 |
| 5,770,469 | 6/1998 | Uram et al. | 437/240 |
| 5,807,792 | 9/1998 | Ilg et al. | 438/758 |

FOREIGN PATENT DOCUMENTS

| | | |
|---|---|---|
| 0 809 186 A2 | 5/1997 | European Pat. Off. . |
| 0 908 946 A3 | 9/1998 | European Pat. Off. . |
| 94 12 376 U1 | 1/1996 | Germany . |
| 61-245541 | 10/1986 | Japan . |
| 7-245342 | 9/1995 | Japan . |

OTHER PUBLICATIONS

IBM Technical Disclosure Bulletin, vol. 31, No. 11, dated Apr. 1989 entitled Automatic Unlimited Dynamic Memory Relocation.

*Primary Examiner*—William Powell
*Assistant Examiner*—George Goudreau
*Attorney, Agent, or Firm*—Stanton C. Braden

[57] ABSTRACT

Improved gap fill of narrow spaces is achieved by using a doped silicate glass having a dopant concentration in a bottom portion thereof which is greater than an amount which causes surface crystal growth and in an upper portion thereof having a lower dopant concentration such that the overall dopant concentration of the doped silicate glass is below that which causes surface crystal growth.

9 Claims, 3 Drawing Sheets

GAPFILL OF SEMICONDUCTOR STRUCTURE USING DOPED SILICATE GLASSES

BACKGROUND OF THE INVENTION

The invention relates to device fabrication. In device fabrication, insulating, semiconducting, and conducting layers are formed on a substrate. The layers are patterned to create features and spaces, forming devices, such as transistors, capacitors, and resistors. These devices are then interconnected to achieve a desired electrical function, producing an integrated circuit (IC).

Doped silicate glass is used as, for example, an insulating layer between conductive or semiconductive layers in the manufacture of ICs. In particular, the use of doped silicate glass such as borophohsosilicate glass (BPSG) is attractive due to its ability to reflow when annealed at a sufficiently high temperature. As such, doped silicate glass can be used to fill gaps relatively small gaps without voids. As the term is used herein, the term "gap" refers to any generic nonplanar feature on a given surface and may include such features as trenches or spaces between gates of transistors.

Conventionally, doped silicate glass such as BPSG is formed by various chemical vapor deposition (CVD) techniques. The BPSG is deposited at a relatively low temperature of about 400° C. After deposition, the substrate is heated to a high enough temperature to cause the glass to soften. For example, annealing BPSG having B and P concentrations of about 4 wt % each at a temperature of 800° C. for about 30 minutes can fill structures as narrow as 0.25 µm with aspect ratios of up to 3:1 without voids.

The dopant concentration of the B in the BPSG affects its reflow or melting temperature. The higher the B concentration, the lower the reflow temperature and vice-versa. Thus, increasing the B concentration improves the glass ability to fill gaps at a given temperature. Generally, it is desirable to have as high a B concentration to enable filling of small gaps with a lower thermal budget. However, if the total dopant concentration of the BPSG or doped silicate glass exceeds an upper limit, the dopants tend to precipitate and form acid crystals on the surface. Such surface crystals adversely affect the reliability and characteristics of subsequently formed layers. Typically, the upper limit of dopant concentration is about 11 wt % (all percentages are wt %). Of course, this limit may vary depending on the type of doped silicate glass and deposition conditions.

As dimensions continue to decrease in advance IC designs, the doped silicate glass is required to fill narrower structures with higher aspect ratios. Due to the inherent upper limit in the dopant concentration of the doped silicate glass, a higher temperature anneal of longer duration is required in order to satisfy the needs of advanced IC designs. However, such an anneal typically exceeds the allowable thermal budget, resulting in a non-existing manufacturable process window.

As shown from the above discussion, it is desirable to provide filling of narrow structures with high aspect ratios having a manufacturable process window.

SUMMARY OF THE INVENTION

The invention relates to improved gap fill of narrow spaces in the fabrication of integrated circuits.

Improved gap fill is achieved by providing a doped silicate glass having a dopant concentration gradient which is higher in the bottom than at the top. This allows the doped silicate glass to have a very high dopant concentration at the bottom where gap fill is important and a lower concentration at the top where gap fill is not an issue. As such, the overall concentration of the doped silicate glass is lower than that which causes surface crystal growth while achieving better gap fill than conventional doped silicate glass layers.

DETAILED DESCRIPTION OF THE INVENTION

Figure 1:
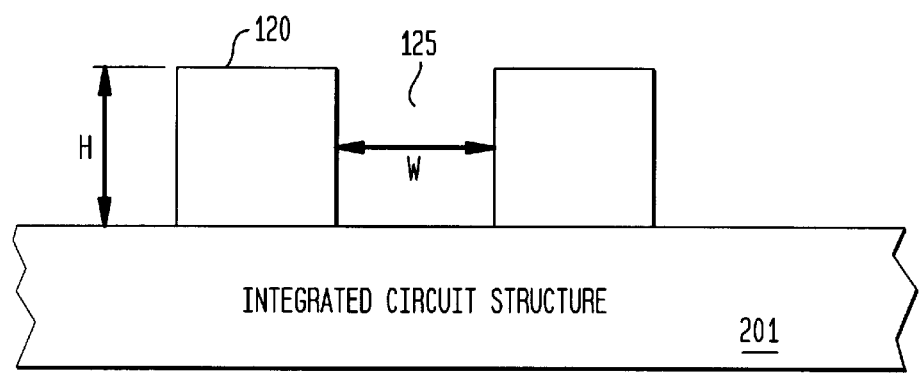
FIG. 1 shows a cross-section of an integrated circuit with device features separated by narrow spaces.

The invention relates to doped silicate glass as used in, for example, an insulating layer in IC fabrication. Referring to FIG. 1, a cross-section of a portion of an IC structure formed on a substrate 101 is shown. The IC structure, which is not shown in detail, is, for example, a portion of a memory IC including a random access memory (RAM), a dynamic RAM (DRAM), a synchronous DRAM (SDRAM), a static RAM (SRAM), or a read only memory (ROMs). Alternatively, the IC structure may be a logic IC such as a programmable logic array (PLA), an application specific IC (ASIC), a merged DRAM-logic IC (embedded DRAM), or any other logic circuit.

Typically, numerous ICs are fabricated on a semiconductor substrate, such as a silicon wafer, in parallel. After processing, the wafer is diced in order to separate the ICs into a plurality of individual chips. The chips are then packaged into final products for use in, for example, consumer products such as computer systems, cellular phones, personal digital assistants (PDAs), and other electronic products.

The substrate 201 is, for example, a silicon wafer. Other substrates such as silicon on insulator (SOI), silicon on sapphire (SOS), germanium, gallium arsenide, and group III-V compounds, are also useful. The major surface of the substrate is not critical and any suitable orientation such as a (100), (110), or (111) is useful. The substrate, for example, includes a plurality of devices such as trench capacitors (not shown) formed therein. Such trench capacitors serve as storage capacitors for DRAM cells. Formation of the trench capacitors is achieved using conventional techniques.

As shown, device features 120 are provided on the surface of the substrate. The device structures, for example, are gates of transistors. In one embodiment, the transistors represent wordlines that connect a plurality of memory cells in a memory array.

Typically, the gates include a gate oxide layer, a doped poly layer, and a cap nitride layer. In some embodiments, the poly layer may comprise a polycide layer that includes a layer of silicide over a doped poly layer. A nitride liner is provided over the device structures, serving as an etch stop for borderless contact formation.

The device structures are separated by gaps 125, creating an uneven surface topology on the substrate surface. The aspect ratio of the gaps is defined by the height H of the device structures over the width W of the space separating them.

In accordance with the invention, a technique for forming a doped silicate glass layer over uneven surface topography is provided. The invention enables the formation of doped silicate glass that fills small gaps having relatively high aspect ratios without voids as well as the formation of surface crystals with a reduced thermal budget, resulting in a larger manufacturable process window.

The doped silicate glass has a predetermined thickness. The predetermined thickness, of course, depends on the specific application. For example, when used as an interlevel dielectric layer, the thickness of the doped silicate glass is sufficient to provide isolation between the device structures and the overlying conductive layer. The deposited thickness should also take into account the planarization and any other processes that erode the thickness of the layer. Typically, for a 256 Megabit DRAM employing 0.25 $\mu$m groundrule (GR), the thickness of the doped silicate glass is about 0.75 to 1.2 $\mu$m. Of course, the actual thickness may be optimized for different GRs and applications.

Figure 2:
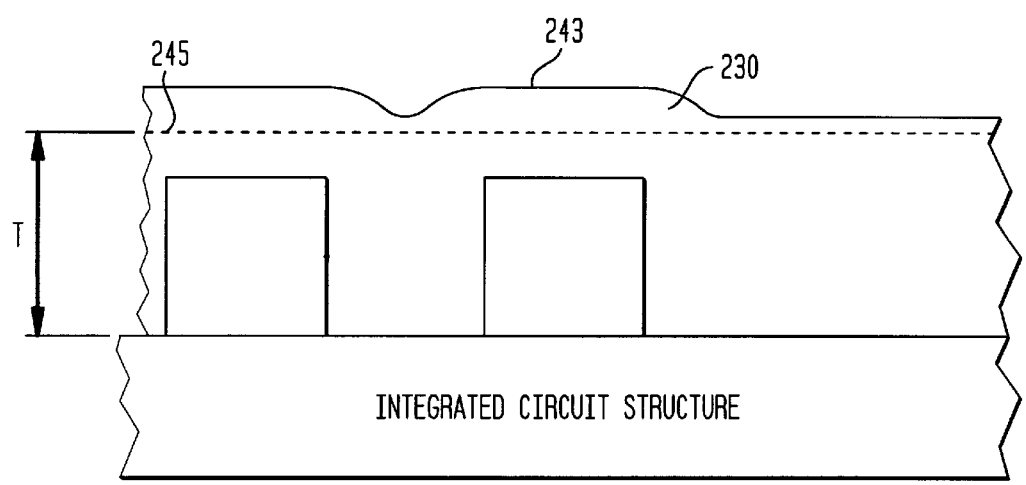
FIG. 2 shows a device layer in accordance with one embodiment that provides improved gap fill of the narrow spaces.

Referring to FIG. 2, a doped silicate glass layer 230 is formed in accordance with the invention. The doped silicate glass in one embodiment comprises B. B dopants are desirable as they lower the melting point of the silicate glass. Other dopants, such as germanium (Ge), which lower the melting temperature of the doped silicate glass are also useful. In addition, the doped silicate glass can include other dopants. For example, P may be added to improve gettering. In accordance with the invention, the doped silicate glass comprises a dopant concentration gradient, wherein the dopant concentration is greatest at the bottom and decreases toward the tip of the layer.

The dopant concentration of the doped silicate glass can be varied over a wide range from bottom to top. In one embodiment, the dopant concentration at the bottom of the doped silicate glass comprises a dopant concentration greater than an amount that causes surface crystal growth. In the upper portion, the dopant concentration is decreased, providing a layer having an overall concentration below an amount that causes surface crystal growth. As we move toward the top of the layer, the dopant concentration is decreased.

By depositing a layer with a concentration gradient which decreases toward the surface, the lower portion can comprise a significantly higher dopant concentration, enabling the filling of much smaller gaps having high aspect ratios while the overall concentration of the glass is maintained below that which causes surface crystal growth. As a result, a reliable doped silicate glass layer with much higher gapfill characteristics over conventional doped silicate glass is provided.

As shown, a top surface 243 of the doped silicate glass is non-planar. After deposition is completed, the doped silicate glass is planarized by, for example, chemical mechanical polish (CMP). The CMP removes a portion of the doped silicate glass layer in order to provide a planar top surface depicted by dotted line 245. As a result, a doped silicate glass with a planar top surface having a predetermined thickness T is provided.

As discussed, the actual thickness T is determined by design parameters such as functionality of the layer as an insulator. The doped silicate glass can be deposited by various deposition techniques, one of which may be chemical vapor deposition (CVD). In one embodiment, the doped silicate glass is deposited at a temperature sufficient to cause reflow. As such, insitu reflow of the doped silicate glass occurs during deposition. Insitu reflow in combination with the high dopant concentration at the lower portions of the doped silicate glass achieves excellent gap fill behavior with a lower thermal budget.

Figure 3:
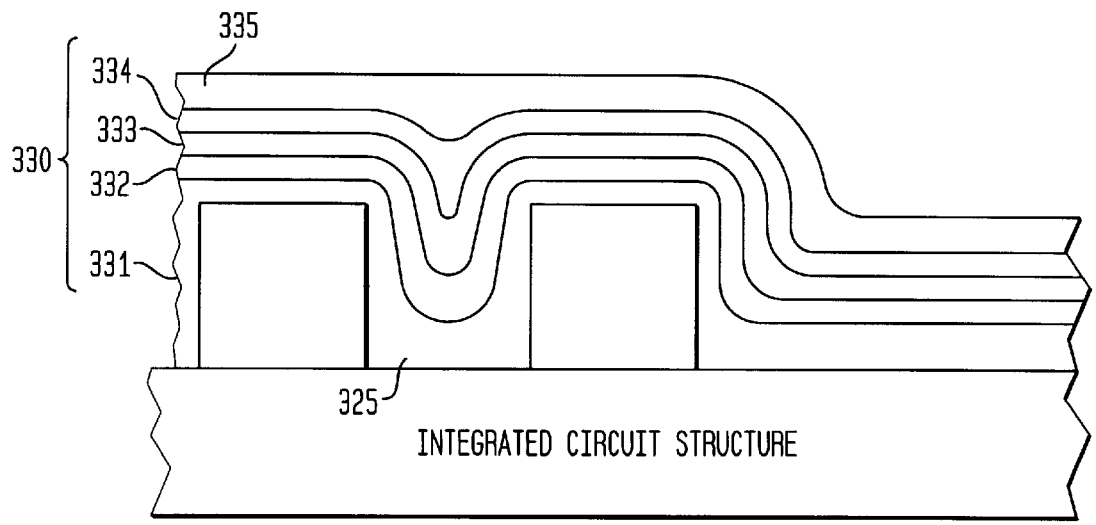
FIG. 3 shows the device layer with improved gap fill in greater detail.

Referring to FIG. 3, a doped silicate glass having a gradient dopant concentration in accordance with the invention is shown. The doped silicate glass is deposted by various CVD techniques. In one embodiment, doped silicate glass comprises BPSG. The doped silicate glass is deposited by low pressure CVD (LPCVD). The deposition temperature range is from about 720 to 870° C., preferably 750 to 850° C. Such a temperature range is sufficient to cause insitu reflow of the doped silicate glass during deposition.

Illustratively, the doped silicate glass includes a plurality of sub-layers. In the illustrative embodiment, the doped silicate glass is shown to include five sub-layers 331–335. The interfaces between adjacent sub-layers are shown for purposes of illustration. The actual doped silicate glass layer may not have such defined interfaces.

As shown, a first sub-layer 331 is formed over the surface of the IC structure. In one embodiment, the total dopant concentration of the bottom of the layer is greater than an amount which causes surface crystal growth. With each subsequent sub-layer, the total dopant concentration therein decreases such that the overall dopant concentration of the sub-layers is below an amount which causes surface crystal growth.

In one embodiment, the total concentration of the dopants in the first sub-layer is about 20 wt %. The P dopants in the BPSG layer are used for gettering.

Typically, the concentration of P is, for example, about 2–6 wt %. Of course, the P concentration can vary depending on design parameters. However, by increasing the total dopant concentration of the first BPSG sub-layer, it can include a correspondingly greater amount of B dopants to lower its melting point. For example, with a P concentration of 2–6 wt %, the B concentration of the B layer can be increased to 14–19 wt %. The dopant concentration incrementally decreases for subsequent sublayers, producing a decreasing gradient from bottom to top. In one embodiment, the total dopant concentration at of the top sub-layer 335 is about 0 wt %. Preferably, the total dopant concentration gradient of the doped silicate glass layer is from about 15–0 wt % from bottom to top, with an overall dopant concentration of the layer of less than that which causes surface crystal growth.

Providing a high dopant concentration in the sub-layer 331 lowers the reflow temperature. As a result, depositing the sub-layer 331 at the high temperature range produces a material with low viscosity that exhibits excellent gap fill characteristics. The insitu reflow facilitates the flowing of the doped silicate glass material to the bottom of the high aspect ratio gap 325. As a result, the aspect ratio of the gap decreased.

The second sub-layer is deposited with a dopant concentration lower than that of the first sub-layer. This is typically achieved by lowering the amount of dopant source material available for the deposition. Due to the decrease in aspect ratio of the gap as a result of the first sub-layer, the gap becomes easier to fill. As such, the lower dopant concentration in the second sub-layer is sufficient to provide filling of the gap 335. Again, the insitu reflow facilitates the flowing of the material to the bottom, further reducing the aspect ratio of the gap.

The aspect ratio of the gap is decreased with each subsequent sub-layer deposition, making it easier to fill. The deposition continues until the doped silicate glass reaches a desired thickness. Thereafter, a CMP planarizes the surface, resulting in a planar doped silicate glass layer having a predefined thickness.

Although the sub-layers, as shown, are relatively equal in thickness, it is not critical to the invention. By providing a doped silicate glass with a gradient dopant concentration, high aspect ratio structures are easily filled with lower thermal budget.

Alternatively, the doped silicate glass comprises BSG. Doped silicate glass comprising dopants, such as Ge or other dopants that reduces the melting point of the material is also useful. Other dopants which serve other purposes, such as gettering, can also be included in the doped silicate glass. What is important is that the doped silicate glass comprises a dopant concentration exceeding a concentration that causes formation of crystals in the bottom portion of the layer. Furthermore, the doped silicate glass also comprises a lower dopant concentration in the upper portion that produces a layer with overall dopant concentration that is below a concentration which causes surface crystal formation. This enables a higher dopant concentration of dopants that decreases the melting point of the material where it is needed to fill narrow gaps while maintaining the overall concentration of the doped silicate glass to that which causes formation of surface crystals. The higher dopant concentration results in better gap fill.

Figure 4A:
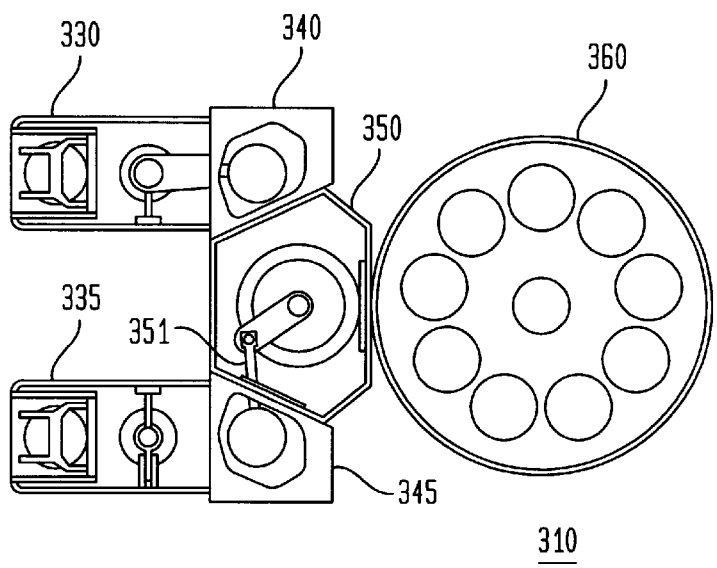
FIGS. 4a–c show a CVD reactor for forming the device layer with improved gap fill characteristics.

In one embodiment, the doped silicate glass layers are formed using a low pressure chemical vapor deposition (LPCVD) process. Other CVD processes are also useful. Referring to FIG. 4a, a simplified top view of a CVD reactor 310 is shown. The reactor is, for example, a DSM™ 9800 that is manufactured by Lam Research Corporation of Fremont. The Lam Integrity DSM 9800 is described in U.S. Pat. No. 4,976,996 issued to Monkowski et al., which is herein incorporated by reference for all purposes. It should be noted that the CVD reactor shown is merely illustrative and variations thereof are also.

As shown, reactor 110 comprises wafer cassette storage bays 330 and 335, loadlock units 340 and 345, transfer chamber 350, and reaction chamber 360. The cassette storage bays store a cassette, such as those used for holding and storing a plurality of wafers in conventional device fabrication. The wafers in the cassettes are transferred to the respective load lock units by wafer transfer arms 331 and 332. The transfer chamber 150 includes a wafer loading arm 351. The wafer loading arm removes a wafer from either loadlock 340 or loadlock 345 and places it in a wafer slot 361 of a rotating platen 365 in the reaction chamber. Illustratively, the platen comprises a plurality of wafer slots. Wafers are loaded into the other slots by rotating the platen to the appropriate position.

Figure 4B:
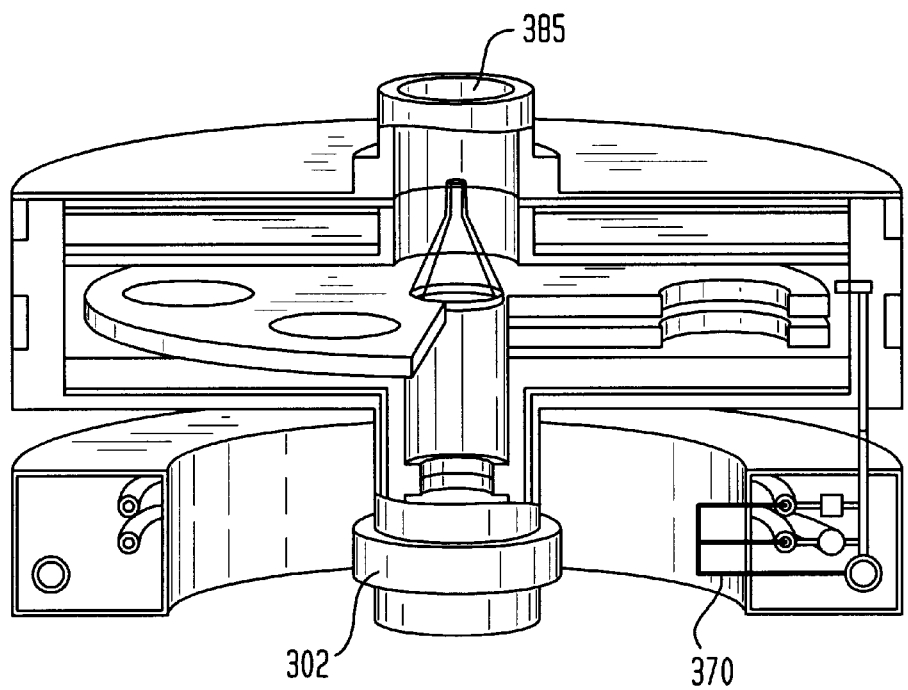

FIG. 4b shows the reaction chamber in greater detail. As shown, the reaction chamber comprises platen 380. The platen rotates around a hub 302 (the direction of rotation of platen 380 is arbitrary). Illustratively, the platen includes a plurality of slots for placement of a wafer therein. Typically, the slots are depressed such that the top surface of the wafer, when placed therein, is substantially planar with the surface of the platen.

A plurality of injectors 350 is located at the circumference of the reaction chamber. Feed lines 370 connected to the injectors provide materials from a supply source for the reaction. The number of feed lines depends on the number of different types of materials used for forming the layer. The materials are mixed and delivered into the reaction area of the chamber by the injectors.

An exhaust port 385 passes excess materials and by-products of the reaction out of the reaction chamber. The exhaust port is formed by, for example, an interior passageway through hub 302 for venting gases from the reactor chamber. As such, the direction of the flow of the chemistry is from injectors toward the center. Alternatively, reversing the direction of chemistry flow is also useful. Reversing the flow is achieved by locating the injectors at the center of the chamber and the exhaust vents at the circumference of the chamber.

The reactor is essentially isothermal. In one embodiment, heaters (not shown for ease of illustration), which may be resistive, are strategically located throughout the reactor chamber to compensate for any heat loss. In this manner, a constant temperature may be maintained during the deposition process. For example, there may exist an inner heater proximate to exhaust port 306 to compensate for the heat loss therethrough. An outer heater surrounding the reactor chamber compensates for the heat loss to the outside world. Preferably, there is also provided a resistive middle heater, which radiates heat to the entire chamber to maintain a suitable wafer temperature during deposition.

Figure 4C:
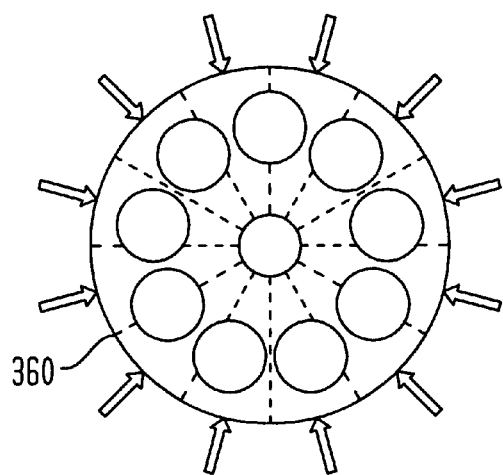

Referring to FIG. 4c, an illustrative reaction chamber is provided with twelve injectors (depicted by arrows). Providing the reaction chamber with a fewer or a greater number of injectors is also useful. The injectors are equally spaced apart at the periphery of the reaction chamber. Each injector therefore defines a 30° injection area in the reactor chamber, as delineated by the dotted lines. In other words, each injector injects into a different sector of the reactor. Such an injection scheme is referred to as a segmented delivery system.

In operation, source materials for the silicate glass, which typically are in gaseous form, are injected into the reaction chamber via the injectors. The source material flows from the injectors toward the center of the reaction chamber. Simultaneously, the platen supporting the wafers is rotated, moving the wafers through the injected source materials. As the source materials contact the wafer surfaces, they chemically react to deposit doped silicate glass thereon. Excess source materials and their by-products are exhausted through exhaust port.

In operation, source materials for the silicate glass, which typically are in gaseous form, are injected into the reaction chamber via the injectors. The source material flows from the injectors toward the center of the reaction chamber. Simultaneously, the platen supporting the wafers is rotated, moving the wafers through the injected source materials. As the source materials contact the wafer surfaces, they chemically react to deposit doped silicate glass thereon. Excess source materials and their by-products are exhausted through exhaust port.

In accordance with one embodiment of the invention, source materials that make up BPSG are injected into the reaction chamber. In one embodiment, two source materials or chemistries are injected to form BPSG. The first chemistry comprises, for example, TEB/TEOS/$O_2$/$N_2$. The TEOS (tetraethoxysilane) is the source of silicon, TEB (triethyl borate) provides the source of boron (B) dopant atoms, and $O_2$ and $N_2$ are carrier gases. The second source material comprises a phosphine chemistry such as $PH_3$/$O_2$/$N_2$. $PH_3$ (phosphine) provides the source of phosphorus (P) dopant atoms, and $O_2$ and $N_2$ are oxidation and carrier gases. Other chemistries used in forming BPSG are also useful.

The two chemistries are, for example, flowed into the reaction chamber via alternating injectors. The formation of the BPSG layer is achieved using conventional process conditions, such as those described in Tedder et al., Appl. Phys. Lett. 62, p. 699 (1993), which is herein incorporated by reference for all purposes.

In one embodiment, the dopant concentration varies over the deposition of the BPSG layer. The concentration of the dopants in the bottom is greater than an amount which causes surface crystal growth. The concentration, for example, is about 20 wt %. Preferably, the concentration of dopants is about 15 wt % at the bottom. P dopants are provided for gettering purposes. Typically the P concentration is about 2–6 wt %. As such, the concentration of B, which lowers the melting point of the BPSG, is about 14–18 wt %. Of course, the actual concentration depends on the design requirement. Since the concentration of the dopant that lowers the melting point of the BPSG is relatively high, reflow is enhanced. This enables the lower portion of the BPSG to fill smaller gaps having a higher aspect ratio than, for example, 4:1.

The concentration of dopants in the upper portion of the layer is less than the bottom portion so as to provide a BPSG layer having an overall dopant concentration below that which causes surface crystal growth. For example, the layer can comprise a dopant concentration gradient that is about 20 wt %, preferably 15 wt %, and decreases toward the top to provide a layer having an overall dopant concentration less than that which causes surface crystal growth. In one embodiment, the concentration at the upper portion is about 0 wt %.

While this invention has been described in terms of several illustrative embodiments, there are alterations, permutations, and equivalents which fall within the scope of this invention. It should also be noted that there are many alternative ways of implementing the processes of the present invention. It is therefore intended that the following appended claims be interpreted as including all such alterations, permutations, and equivalents which fall within the true spirit and scope of the present invention.

What is claimed is:

1. A method of fabricating an integrated circuit comprising the steps of:

providing a substrate comprising high aspect ratio device features separated by narrow spaces; and forming a doped silicate glass layer over the substrate surface, the doped silicate glass layer comprising a dopant concentration gradient wherein the bottom portion of the doped silicate glass comprises a dopant concentration that is greater than an amount which causes surface crystal growth, so as to decrease the melting point of the glass to provide gap fill of the narrow spaces, and wherein an upper portion of the doped silicate glass comprises a dopant concentration lower than the bottom portion, to result in the doped silicate layer having a combined dopant concentration that is below that which causes surface crystal growth.

2. The method of fabricating an integrated circuit as recited in claim 1, wherein the dopant concentration of the bottom portion is about 20 wt %.

3. The method of fabricating an integrated circuit as recited in claim 1, wherein the dopant concentration of the top portion is about 0 wt %.

4. The method of fabricating an integrated circuit as recited in claim 1, wherein the doped silicate glass layer is BSPG.

5. The method of fabricating an integrated circuit as recited in claim 1, wherein the doped silicate glass layer is BSG.

6. The method of fabricating an integrated circuit as recited in claim 1, wherein the doped silicate glass layer includes Ge.

7. The method of fabricating an integrated circuit as recited in claim 1, wherein the dopant concentration varies across the thickness from about 15 wt % at the bottom portion to about 0 wt % at the top portion.

8. The method of fabricating an integrated circuit as recited in claim 1, further comprises the step of chemical mechanical polishing the silicate glass layer to planarize the surface.

9. The method of fabricating an integrated circuit as recited in claim 1, wherein the step of forming further comprises heating the glass silicate layer to reflow the glass silicate to fill gaps between the features.

* * * * *